(12) United States Patent
Sung et al.

(10) Patent No.: US 8,101,515 B2
(45) Date of Patent: Jan. 24, 2012

(54) METHODS OF MANUFACTURING SEMICONDUCTOR DEVICES HAVING CONTACT PLUGS IN INSULATION LAYERS

(75) Inventors: Joon-ho Sung, Busan (KR); Ju-yong Lee, Gyeonggi-do (KR); Mi-kyung Park, Gyeonggi-do (KR); Tae-young Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 144 days.

(21) Appl. No.: 12/766,137

(22) Filed: Apr. 23, 2010

(65) Prior Publication Data

US 2010/0210087 A1 Aug. 19, 2010

Related U.S. Application Data

(63) Continuation of application No. 12/108,012, filed on Apr. 23, 2008, now Pat. No. 7,732,323.

(30) Foreign Application Priority Data

Oct. 23, 2007 (KR) .................. 10-2007-0106740

(51) Int. Cl.
*H01L 21/4763* (2006.01)
*H01L 21/44* (2006.01)
*H01L 21/60* (2006.01)
*H01L 21/74* (2006.01)
H01L 21/8238 (2006.01)
H01L 21/8234 (2006.01)
H01L 21/8242 (2006.01)
H01L 21/20 (2006.01)

(52) U.S. Cl. ........ 438/620; 438/597; 438/233; 438/238; 438/256; 438/396; 257/E21.507; 257/E21.537

(58) Field of Classification Search .................. 438/620, 438/597, 233, 238, 256, 396; 257/E21.507, 257/E21.537
See application file for complete search history.

(56) References Cited

U.S. PATENT DOCUMENTS 6,849,923 B2 2/2005 Seta et al.
(Continued)

FOREIGN PATENT DOCUMENTS

JP 2003-017590 1/2003
(Continued)

OTHER PUBLICATIONS

Zargham, M. R. & Tragoudas, T. (2000) Layout, Placement and Routing. In the Electrical Engineering Handbook (§ 25.22). Boca Raton: CRC Press LLC.

*Primary Examiner* — Charles Garber
*Assistant Examiner* — Calvin Choi
(74) *Attorney, Agent, or Firm* — Myers Bigel Sibley & Sajovec

(57) ABSTRACT

Methods of manufacturing semiconductor devices are provided in which a first contact plug is formed on a first active region in a substrate and a second contact plug is formed on a second active region in the substrate. A height of an upper surface of the second contact plug from the substrate is greater than a height of an upper surface of the first contact plug from the substrate. A third contact plug is formed on the second contact plug. A first spacer is formed on a side surface of the third contact plug. A third interlayer insulation layer is formed that covers the third contact plug. The third interlayer insulation layer is patterned to form a third opening that exposes the first contact plug. A fourth contact plug is formed in the third opening that is electrically connected to the first contact plug.

12 Claims, 8 Drawing Sheets

U.S. PATENT DOCUMENTS

| | | |
|---|---|---|
| 2002/0173096 A1 | 11/2002 | Okudaira |
| 2007/0123040 A1 | 5/2007 | Hwang et al. |

FOREIGN PATENT DOCUMENTS

| | | |
|---|---|---|
| KR | 1020020066586 A | 8/2002 |
| KR | 1020020078310 A | 10/2002 |

METHODS OF MANUFACTURING SEMICONDUCTOR DEVICES HAVING CONTACT PLUGS IN INSULATION LAYERS

CROSS-REFERENCE TO RELATED PATENT APPLICATION

This application claims priority under 35 U.S.C. §120 as a continuation of U.S. patent application Ser. No. 12/108,012, filed Apr. 23, 2008, now U.S. Pat. No. 7,732,323 which in turn claims priority under 35 U.S.C. §119 from Korean Patent Application No. 10-2007-0106740, filed on Oct. 23, 2007 in the Korean Intellectual Property Office. The disclosure of each of the above applications is incorporated herein in its entirety by reference.

FIELD OF THE INVENTION

The present invention relates to semiconductor devices and, more particularly, to methods of manufacturing semiconductor devices having contact plug structures.

BACKGROUND OF THE INVENTION

With the increase of the integration level of semiconductor devices, electrical insulation between metal lines such as bit lines and/or between metal lines and semiconductor layers may significantly affect the performance and reliability of a semiconductor device. As the integration level of semiconductor devices has increased, it has become more difficult to provide a sufficient process margin when forming a contact pad that is used to connect a transistor to a metal line such as a bit line or to a capacitor. Therefore, a process for forming a self-aligned contact (SAC) pad that is self-aligned to a metal line such as a gate line has been researched.

In the SAC pad forming process, when an opening for the contact pad is formed through an insulation layer, a capping layer and spacer of the metal line are used to self-align the opening on the metal line by suppressing etching. As such, a photoresist mask that has opening regions that are larger than the desired openings can be used as an etching mask while still obtaining sufficient process margin for the photolithography process.

FIG. 1 is a schematic cross-sectional view of a conventional semiconductor device having a contact plug.

Referring to FIG. 1, a gate structure (not shown) including a gate insulation layer, a gate electrode, a capping layer, and a spacer is formed on a semiconductor substrate 10 in which an isolation layer 11 and active regions such as source and drain regions 12 and 14 are defined. It will be appreciated that the semiconductor substrate may be a conventional semiconductor substrate, a semiconductor on insulator substrate, or an epitaxial or other semiconductor layer on a substrate. The gate structure is insulated from other metal lines by a first interlayer insulation layer 16. The first interlayer insulation layer 16 is etched to form openings exposing the active regions 12 and 14 in order to connect the active regions 12 and 14 to a bit line or a capacitor. The capping layer and the spacer in the gate structure may be used as an etching mask. Next, a conductive material such as polysilicon is deposited in the openings to form first and second contact plugs 20 and 30. The first contact plug 20 may comprise a storage contact plug (or a buried contact (BC)) that is electrically connected to the capacitor 40. The second contact plug 30 may comprise a bit line contact plug (or a direct contact (DC)) that is connected to the bit line. The first and second contact plugs 20 and 30 may be formed simultaneously.

The bit line contact plug that is connected to the bit line may include a barrier layer 32 to lower a potential barrier of contacts. The barrier layer 32 may be a single layer, for example, a titanium (Ti) layer or a multi-layer structure such as, for example, a titanium/titanium-nitride (Ti/TiN) layer. The barrier layer 32 may further include a metal layer such as a tungsten (W) layer. The metal layer is generally formed on the layer having titanium. When the barrier layer 32 has titanium, since titanium is highly reactive with silicon, the titanium in the barrier layer 32 naturally reacts with polysilicon in the second contact plug 30 to form a titanium silicide layer 32a at the interface between the second contact plug 30 and the barrier layer 32.

A capping layer 34 is formed on the barrier layer 32 and a spacer 36 is formed on side portions of the barrier layer 32. The capping layer 34 and the spacer 36 protect the barrier layer 32 during subsequent processing steps. The barrier layer 32 is connected to the bit line, and thus the active region (i.e., the source region) 14 is electrically connected to the bit line. Next, an insulation layer 38 that covers the bit line structure including the barrier layer 32 is formed.

The insulation layer 38 is etched to form openings in order to form a storage contact plug 22 that electrically connects the active region (i.e., the drain region) 12 to a capacitor 40. The capping layer 34 and the spacer 36 may be used as an etching mask. However, the spacer 36 may also be etched by the etchant, and thus the spacer 36 may have a profile shown by a dotted line 36a after this etching process is performed. When the spacer 36 is excessively etched, the silicide layer 32a may be exposed to the etchant. Since the etchant may contain, for example, hydrofluoric acid, the exposed silicide layer 32a may be undesirably decomposed by the etchant. As a result, the electrical contact of the active region 14 with the bit line may be deteriorated and thus a current may leak.

SUMMARY OF THE INVENTION

Pursuant to embodiments of the present invention, methods of manufacturing semiconductor devices having contact plug structures that can reduce or prevent current leakage by improving contact reliability of a bit line contact plug are provided.

Pursuant to certain embodiments of the present invention, methods of manufacturing semiconductor devices are provided in which a first interlayer insulation layer is formed on a semiconductor substrate that includes first and second active regions. The first interlayer insulation layer is patterned to form a first opening that exposes the first active region. A first contact plug is formed by depositing a first conductive material in the first opening. A second interlayer insulation layer is formed on the first interlayer insulation layer and the first contact plug. A second opening is formed in the first and second interlayer insulation layers that exposes the second active region. A second contact plug is formed by depositing a second conductive material in the second opening. A height of the second contact plug from the substrate is greater than a height of the first contact plug from the substrate. A third contact plug is formed on the second contact plug that is electrically connected to the second contact plug. A capping layer is formed on the third contact plug. A first spacer is formed on a side surface of the third contact plug. A third interlayer insulation layer is formed on the second interlayer insulation layer. The third interlayer insulation layer is patterned to form a third opening that exposes the first contact plug. A fourth contact plug that is electrically connected to the first contact plug is formed by depositing a fourth conductive material in the third opening.

The methods may further include forming a groove that spaces the second contact plug from the second interlayer insulation layer by over-etching a portion of the second contact plug such that a region of the second contact plug that is adjacent to the third contact plug has a smaller cross-sectional width and/or area than a region of the second contact plug that is remote from the third contact plug.

The first and second active regions may be drain and source regions, respectively, the first and fourth contact plugs may be storage contact plugs that are connected to a capacitor, and the second and third contact plugs may be bit line contact plugs that are connected to a bit line. In addition, the method may further include forming a capacitor structure that is electrically connected to the fourth contact plug.

A gate structure may be provided on the substrate that has etching selectivity with respect to the first interlayer insulation layer, and the first and second openings may be formed using the gate structure as an etching mask. The first spacer may have etching selectivity with respect to the third interlayer insulation layer. The third opening may be formed using the first spacer as an etching mask. The fourth contact plug may be formed by partly etching the third interlayer insulation layer to form a groove and then further etching the exposed third interlayer insulation layer in the groove using the first spacer as an etching mask.

Each of the first, second, and third interlayer insulation layers may include a silicon oxide layer, a silicon nitride layer, a silicon oxinitride(SiON) layer, or a combination thereof. Each of the first, second, and fourth conductive materials may include polysilicon. The third contact plug may comprise a monolayer having titanium, titanium nitride, tungsten, or a combination thereof or a multilayer in which each layer has titanium, titanium nitride, tungsten, or a combination thereof.

According to further embodiments of the present invention, methods of manufacturing semiconductor devices are provided in which a first interlayer insulation layer is formed on a substrate that includes first and second active regions. The first interlayer insulation layer is patterned to form a first opening that exposes the first active region and a second opening that exposes the second active region. A first conductive layer is deposited in the first and second openings and on the first interlayer insulation layer. The first conductive layer is patterned to form a first contact plug and a second contact plug, where a height of a top surface of the second contact plug from the substrate is greater than a height of a top surface of the first contact plug from the substrate. A second interlayer insulation layer is formed on the first interlayer insulation layer and the first contact plug, where a top surface of the second interlayer insulation layer is coplanar with the top surface of the second contact plug. A third contact plug is formed on the second contact plug that is electrically connected to the second contact plug. A capping layer is formed on the third contact plug. A first spacer is formed on a side surface of the third contact plug. A third interlayer insulation layer is formed on the second interlayer insulation layer, the third interlayer insulation layer covering the third contact plug. The third interlayer insulation layer is patterned to form a third opening that exposes the first contact plug. A fourth contact plug is formed that is electrically connected to the first contact plug by depositing a third conductive material in the third opening.

These methods may further include forming a groove that spaces the second contact plug from the second interlayer insulation layer by over-etching a portion of the second contact plug such that a region of the second contact plug that is adjacent to the third contact plug has a smaller cross-sectional area than a region of the second contact plug that is from the third contact plug. The method may further include forming a second spacer on the side surface of the third contact plug such that the second spacer fills the groove.

The first spacer may have etching selectivity with respect to the third interlayer insulation layer. The third opening may be formed using the first spacer as an etching mask. The fourth contact plug may be formed by partly etching the third interlayer insulation layer to form a groove and then further etching the exposed third interlayer insulation layer in the groove using the first spacer as an etching mask.

In still further embodiments of the present invention, semiconductor devices are provided that includes a substrate having first and second active regions. A gate structure is provided on the substrate. A first contact plug is electrically connected to the first active region. A second contact plug is electrically connected to the second active region. The second contact plug has a height greater than that of the first contact plug from the substrate. A first interlayer insulation layer electrically isolates the first and second contact plugs from each other. A third contact plug is electrically connected to the second contact plug. A capping layer is provided on the third contact plug. One or more spacers are provided on a side surface of the third contact plug. A fourth contact plug is electrically connected to the first contact plug and is insulated from the second and third contact plugs by the spacer. A second interlayer insulation layer electrically isolates the fourth contact plug.

A region of the second contact plug that is adjacent to the third contact plug may have a smaller cross-sectional area than a region of the second contact plug that is remote from the third contact plug. The spacer may extend to the adjacent region having the smaller cross-sectional area.

Pursuant to still further embodiments of the present invention, methods of manufacturing semiconductor devices are provided in which a first contact plug is formed on a first active region in a substrate and a second contact plug is formed on a second active region in the substrate. A height of an upper surface of the second contact plug from the substrate is greater than a height of an upper surface of the first contact plug from the substrate. A third contact plug is formed on the second contact plug. A first spacer is formed on a side surface of the third contact plug. A third interlayer insulation layer is formed that covers the third contact plug. The third interlayer insulation layer is patterned to form a third opening that exposes the first contact plug. A fourth contact plug is formed in the third opening that is electrically connected to the first contact plug.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
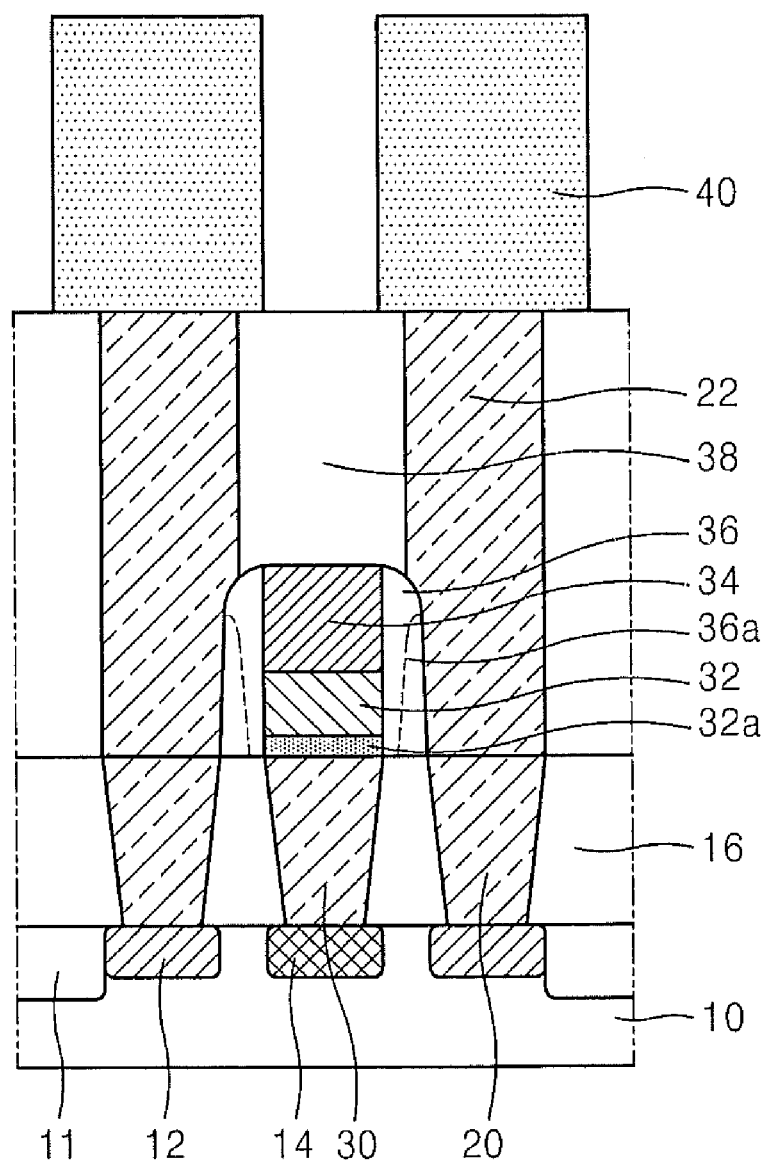
FIG. 1 is a schematic cross-sectional view of a conventional semiconductor device having a contact plug.

The present invention will now be described more fully with reference to the accompanying drawings, in which exemplary embodiments of the invention are shown. It will be appreciated, however, that the example embodiments illustrated herein are exemplary in nature and are not intended to be limiting. In the drawings, the thicknesses of layers and regions may be exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, these elements should not be limited by these terms. These terms are only used to distinguish one element from another element. Thus, a first element discussed below could be termed a second element without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art in the relevant field. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A through 2J are cross-sectional views illustrating methods of forming a semiconductor device having a contact plug according to embodiments of the present invention.

Figure 2A:
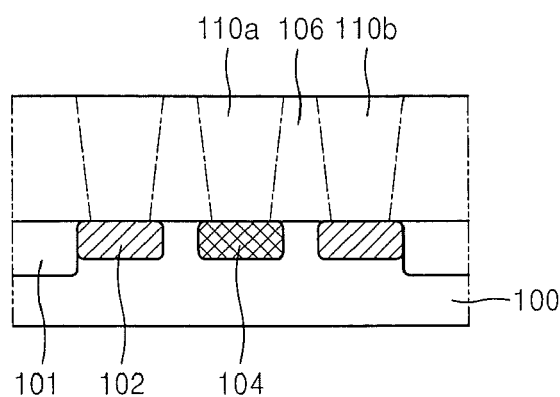
FIGS. 2A through 2J are cross-sectional views illustrating methods of forming a semiconductor device having a contact plug according to embodiments of the present invention and the resulting semiconductors devices.

Referring to FIG. 2A, a substrate 100 in which an isolation layer 101 and first and second active regions 102 and 104 are defined is prepared. It will be appreciated that the semiconductor substrate may be, for example, a conventional semiconductor substrate, a semiconductor on insulator substrate, or an epitaxial or other semiconductor layer on a substrate. The isolation layer 101 may be, for example, a shallow trench isolation (STI) layer. The first and second active regions 102 and 104 may be, for example, source and drain regions. A gate structure (not shown) may be previously formed on the substrate 100. The gate structure may include, for example, a gate insulation layer, a gate electrode, a capping layer, and a gate spacer. A first interlayer insulation layer 106 is formed to cover the gate structure (not shown). The first interlayer insulation layer 106 may be, for example, a silicon oxide layer, a silicon nitride layer, a silicon oxinitride layer, or a combination thereof. However, these examples are for illustrative purposes only and are not intended to be limiting. Portions 110a, 110b of the first interlayer insulation layer 106 defined by dashed-dotted lines in FIG. 2A indicate locations where first and second contact plugs 120 and 130 (see FIG. 2C) that are electrically connected to the first and second active regions 102 and 104, will be formed.

Figure 2B:
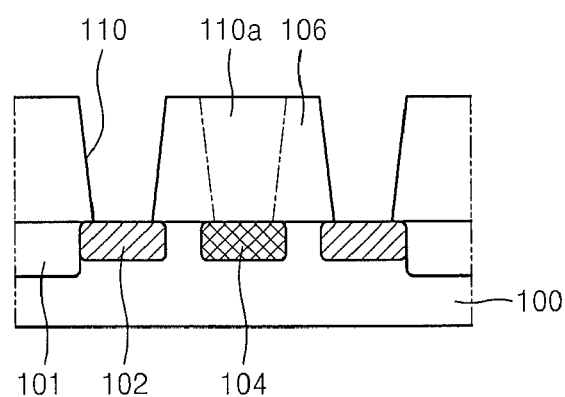

Referring to FIG. 2B, a first opening 110 is formed to expose the first active region 102 by patterning the first interlayer insulation layer 106. The second active region 104 is not exposed by such patterning. The patterning may be performed, for example, using a typical lithographic process using a photoresist mask, a hard mask, or the like.

Figure 2C:
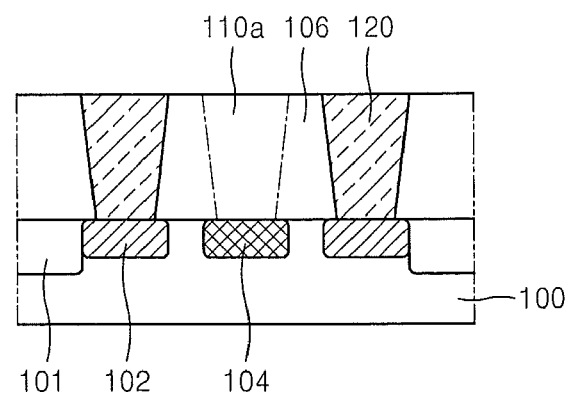

Referring to FIG. 2C, a first conductive material is deposited in the first opening 110 to form the first contact plug 120. In certain embodiments, the first conductive material may be, for example, polysilicon. The gate structure may have etching selectivity with respect to the first interlayer insulation layer 106, and thus the first opening 110 may be formed using the gate structure as an etching mask. The first contact plug 120 may be planarized through an etch-back process or a chemical mechanical polishing (CMP) process so that an upper surface of the first contact plug is coplanar with respect to an upper surface of the first interlayer insulation layer 106.

Figure 2D:
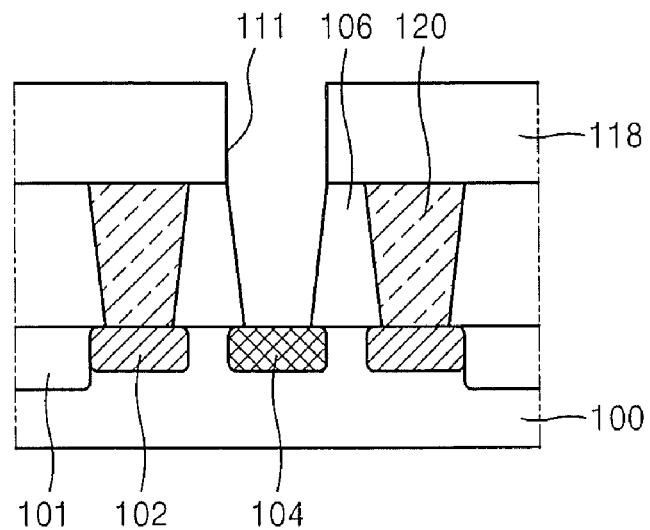

Referring to FIG. 2D, a second interlayer insulation layer 118 is formed to cover the first interlayer insulation layer 106 and the first contact plug 120, and a second opening 111 is formed to expose the second active region 104 by patterning the second interlayer insulation layer 118 and the first interlayer insulation layer 106. In some embodiments, the second interlayer insulation layer 118 may be, for example, a silicon oxide layer, a silicon nitride layer, a silicon oxinitride layer, or a combination thereof.

Figure 2E:
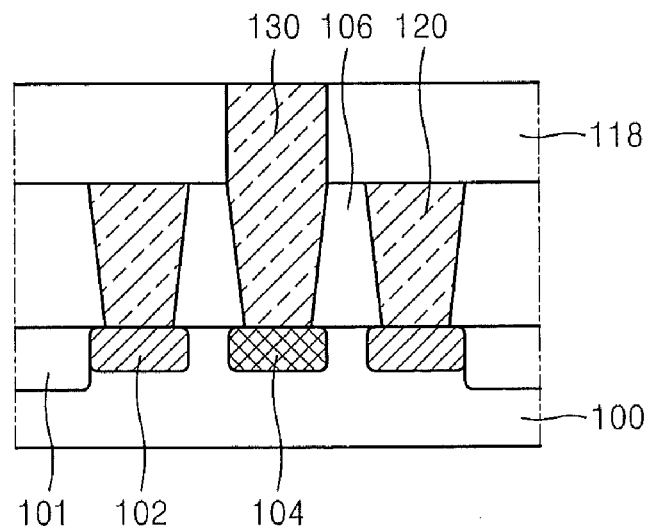

Referring to FIG. 2E, a second conductive material is deposited in the second opening 111 to form the second contact plug 130. The second conductive material may be, for example, polysilicon. In some embodiments, the second conductive material may be same as the first conductive material. As described above, the gate structure may have etching selectivity with respect to the first interlayer insulation layer 106, and thus may be formed to have a etching selectivity such that the second opening 111 may be formed using the gate structure as an etching mask. The second contact plug 130 is insulated from the first contact plug 120 by the first interlayer insulation layer 106 and the second interlayer insulation layer 118. A height of the second contact plug 130 above the substrate 100 is greater than a height of the first contact plug 120 above the substrate 100. The second contact plug 130 may also be planarized through an etch-back process or a chemical mechanical polishing (CMP) process, as described above, so that an upper surface of the second contact plug 130 is coplanar with respect to an upper surface of the second interlayer insulation layer 118.

Figure 2F:
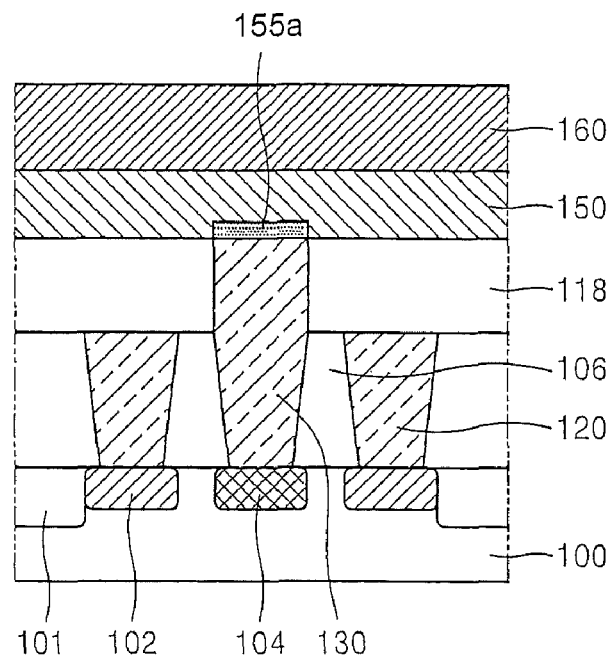

Referring to FIG. 2F, a conductive layer 150 is formed on the second contact plug 130 and the second interlayer insulation layer 118, and a capping insulation layer 160 is formed on the conductive layer 150. The conductive layer 150 may be, for example, a monolayer that includes polysilicon or metal or a multilayer having polysilicon, metal or both. For example, in exemplary embodiments, the conductive layer 150 may be a titanium layer, a titanium nitride layer, a tungsten layer, or a combination thereof. In embodiments where the second contact plug 130 is formed of polysilicon and the conductive layer 150 is formed of titanium, a silicide (TiSix) layer 155a may be naturally formed by reaction of the polysilicon with the titanium. Such a silicide layer 155a may also be formed, for example, when the conductive layer 150 is formed of cobalt, nickel, or tungsten. The capping insulation layer 160 may contain silicon nitride.

Figure 2G:
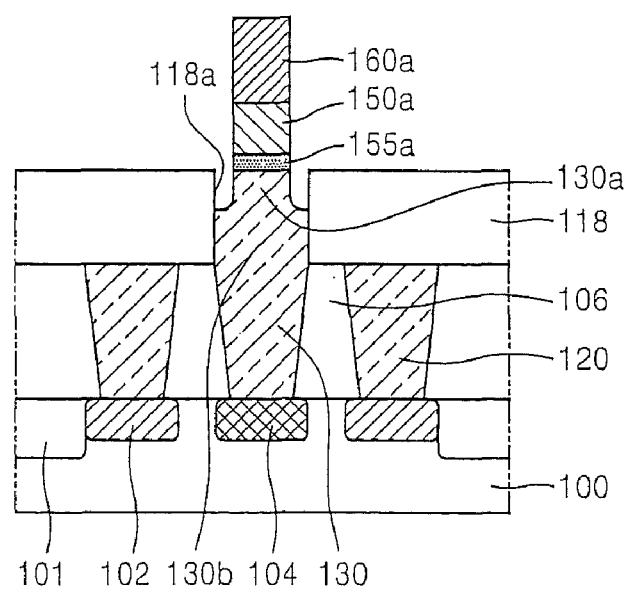

Referring to FIG. 2G, a third contact plug 150a that is electrically connected to the second contact plug 130 is formed, and a capping layer 160a is formed on the third contact plug 150a by patterning the capping insulation layer 160 and the conductive layer 150 having the silicide layer 155a. The cross-sectional width of the third contact plug 150a and the capping layer 160a may be equal to or less than the cross-sectional width of the upper portion of the second contact plug 130. Likewise, the cross-sectional area of the third contact plug 150a and the capping layer 160a may be equal to or less than the cross-sectional area of the upper portion of the second contact plug 130.

In certain embodiments of the present invention, the second contact plug 130 may be partly over-etched so that an upper region 130a of the second contact plug 130 that is adjacent to the third contact plug 150a has a smaller cross-sectional width and/or area than a region 130b of the second contact plug that is remote from the third contact plug 150a. As a result, the upper region 130a of the second contact plug 130 is spaced part from the second interlayer insulation layer 118 by a groove 118a that is formed by the over-etching. In such embodiments, the third contact plug 150a and the capping layer 160a may have a cross-sectional width and/or area that is equal to or smaller than the corresponding cross-sectional width and/or area of the region 130a of the second contact plug 130.

Figure 2H:
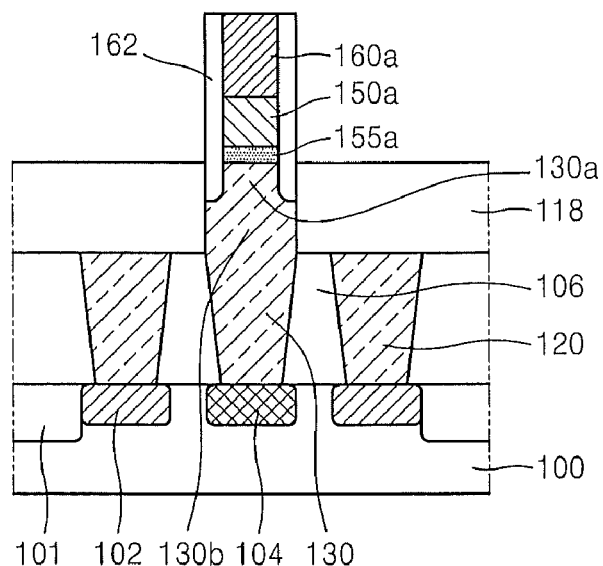

Referring to FIG. 2H, a second spacer 162 may be deposited in the groove 118a (note that herein the term "deposited" is used to refer to any method of depositing or otherwise forming a layer or element of the device). The second spacer 162 may cover side surfaces of the third contact plug 150a and the capping layer 160a. As the second spacer 162 may completely cover the silicide layer 155a, it may reduce or prevent the silicide layer 155a from coming into contact with the etchant in the subsequent etching processes. As a result, the reaction of the silicide layer 155a with the etchant can be reduced or prevented. The forming of the second spacer 162 may be omitted in some embodiments.

Figure 2I:
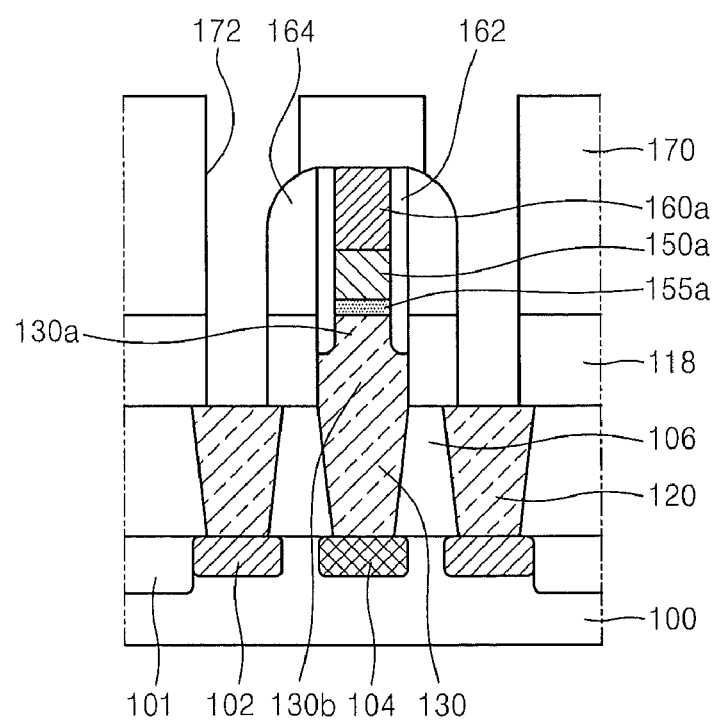

Referring to FIG. 2I, a first spacer 164 is formed to cover side surfaces of the third contact plug 150a and the capping layer 160a, as well as side surfaces of the second spacer 162 in embodiments which include such a second spacer 162. Next, a third interlayer insulation layer 170 is formed to cover the first spacer 164. In some embodiments, the third interlayer insulation layer 170 may comprise, for example, a silicon oxide layer, a silicon nitride layer, a silicon oxinitride layer, or a combination thereof. Next, a third opening 172 that exposes an upper surface of the first contact plug 120 is formed by patterning the third interlayer insulation layer 170.

The first spacer 164 may have etching selectivity with respect to the third interlayer insulation layer 170. For example, in some embodiments, the first and second spacers 162 and 164 may comprise silicon nitride spacers and the third interlayer insulation layer 170 may comprise silicon oxide or vice versa to provide such etching selectivity. When such etching selectivity is provided, the first spacer 164 can be used as an etching mask when forming the third opening 172. When the second spacer 162 is provided, the second spacer 162 may also be used with or without the first spacer 164 as the etching mask.

In certain embodiments, the third opening 172 may be formed by forming a small hole that exposes the first contact plug 120 after partly etching the third interlayer insulation layer 170. In other embodiments, a groove may be formed by partially etching the third interlayer insulation layer 170, and thereafter etching the bottom of the groove using the first spacer 164 (and the second spacer 162, if provided) as an etching mask to expose the first contact plug 120.

Figure 2J:
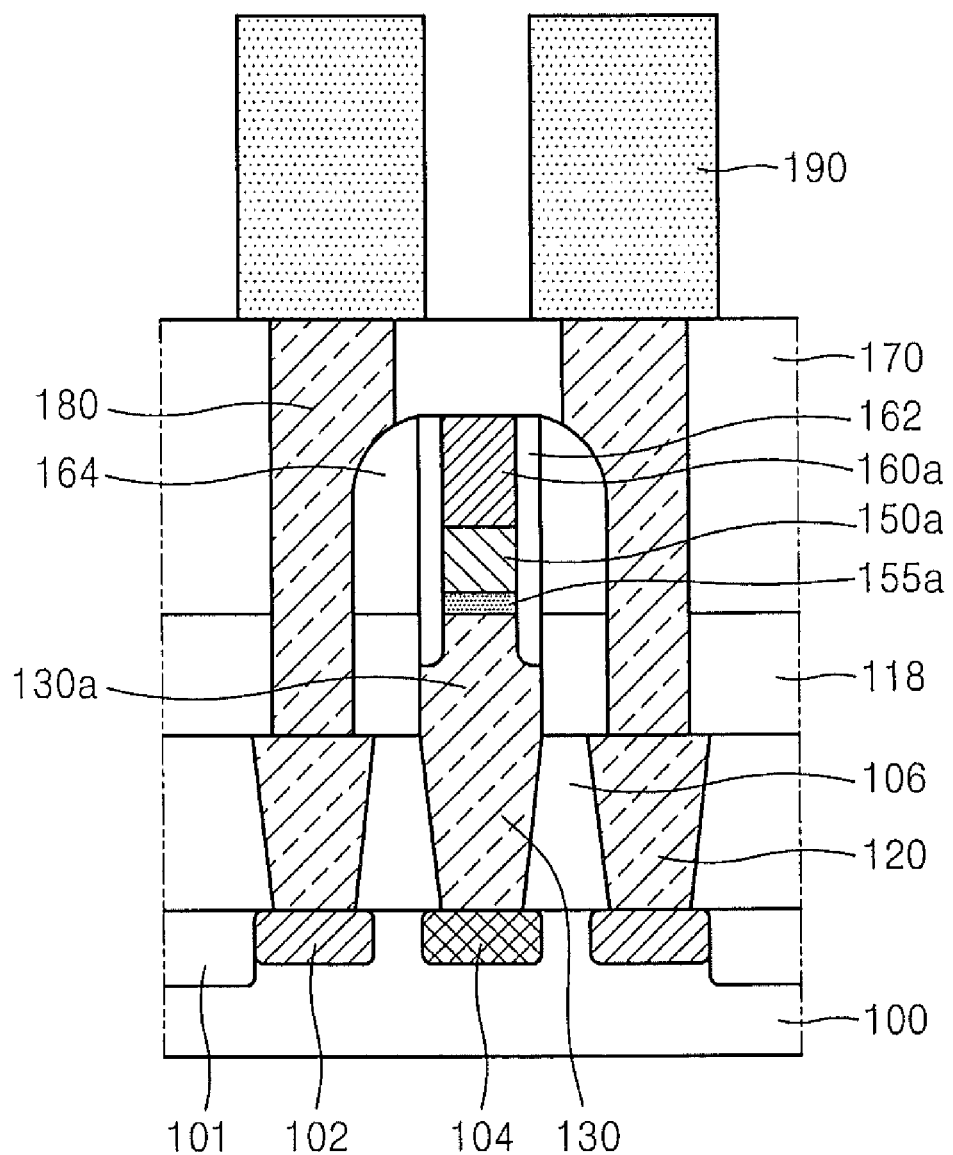

Referring to FIG. 2J, a fourth conductive material is deposited in the third opening 172 to form a fourth contact plug 180 that is electrically connected to the first contact plug 120. The fourth conductive material may be, for example, polysilicon. In addition, the fourth conductive material may be same as the first or second conductive material. This example, however, is for illustrative purposes only and is not intended to limit the scope of the invention.

Next, a capacitor structure 190 that is electrically connected to the fourth contact plug 180 is formed, thereby completing the semiconductor device.

In some embodiments, the first and second active regions 102 and 104 may be drain and source regions. The first and fourth contact plugs 120 and 180 may be storage contact plugs that are connected to the capacitor. The second and third contact plugs 130 and 150a may be bit line contact plugs that are connected to a bit line. In this case, the semiconductor device may a dynamic random access memory (DRAM).

FIGS. 3A through 3E are schematic cross-sectional views illustrating methods of manufacturing semiconductor devices having contact plugs according to further embodiments of the present invention. For simplicity, processes that may be performed in the same manner as corresponding processes of the previous embodiment will not be re-described herein.

Figure 3A:
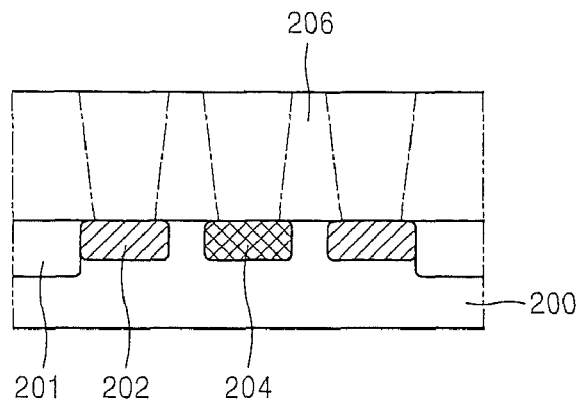
FIGS. 3A through 3E are cross-sectional views illustrating methods of manufacturing a semiconductor device having a contact plug according to further embodiments of the present invention and the resulting semiconductors devices.

Referring first to FIG. 3A, a substrate 200 in which an isolation layer 201 and first and second active regions 202 and 204 are defined is prepared. A gate structure (not shown) may be provided on the substrate 200. A first interlayer insulation layer 206 is formed to cover the gate structure.

Figure 3B:
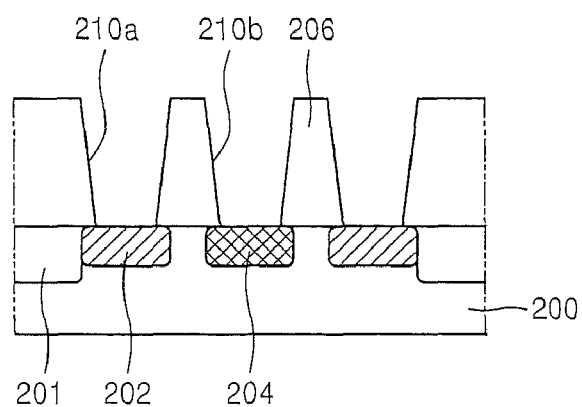

Referring to FIG. 3B, the first interlayer insulation layer 206 is patterned to form first and second openings 210a and 210b that expose the first and second active regions 202 and 204. Unlike in the previous embodiment, all of the first and second active regions 202 and 204 may be exposed by this patterning process.

Figure 3C:
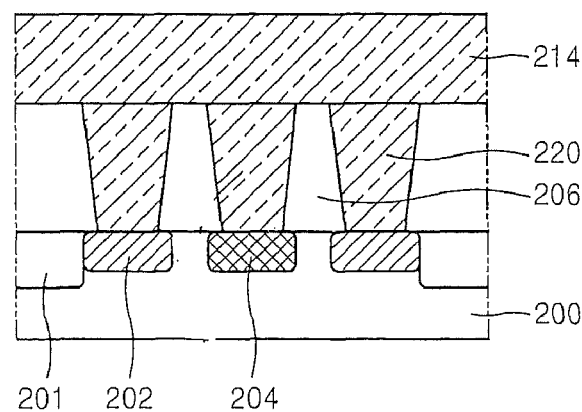

Referring to FIG. 3C, a first conductive material is deposited in the first and second openings 210a and 210b, and a conductive layer 214 is formed to cover the first interlayer insulation layer 206. The conductive layer 214 may be planarized through, for example, an etch-back process or a CMP process.

Figure 3D:
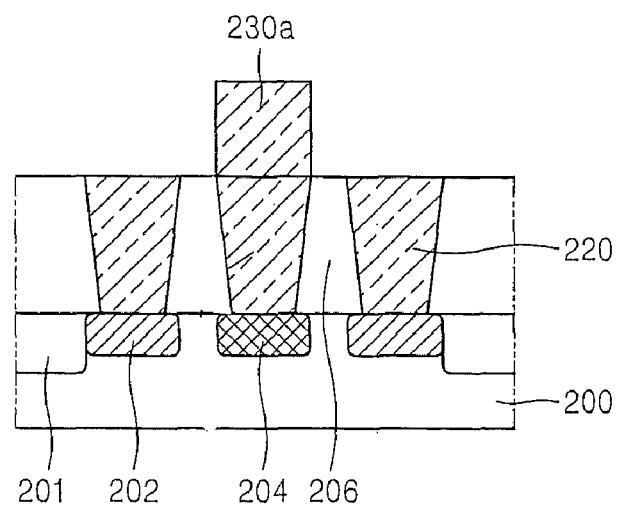

Referring to FIG. 3D, a first contact plug 220 is electrically connected to the first active region 202. A second contact plug 230a is formed by patterning the conductive layer 214. The second contact plug 230a is electrically connected to the second active region 204. A height of the second contact plug 230a from the substrate 200 is greater than a height of the first contact plug 220 from the substrate 200.

Figure 3E:
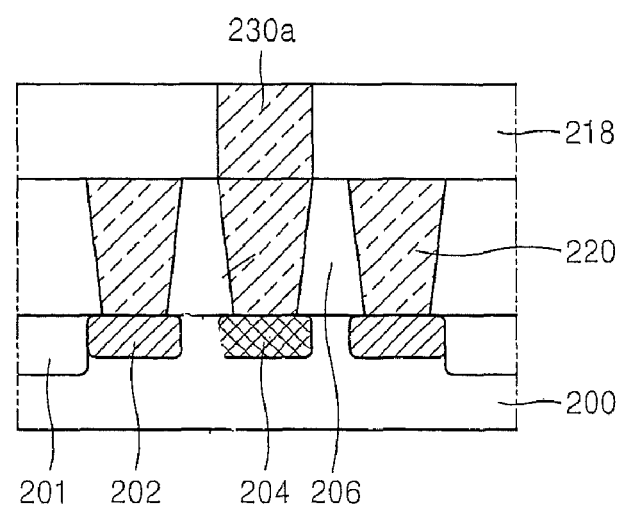

Referring to FIG. 3E, a second interlayer insulation layer 218 is formed to cover the first interlayer insulation layer 206 and the first contact plug 220. The second interlayer insulation layer 218 may be planarized through, for example, an etch-back process or a CMP process such that an upper surface of the second interlayer insulation 218 layer may be coplanar with an upper surface of the second contact plug 230a.

Next, the processes that are described with reference to FIGS. 2F through 2J may be performed to complete the semiconductor device.

Like the previous embodiment, when the second contact plug (see 130 of FIG. 2F) is formed of polysilicon and a conductive layer (see 150 of FIG. 2F) formed on the second contact plug is formed of titanium, a silicide layer (see 155a of FIG. 2F) is naturally formed. Additionally, the second contact plug (see 130 of FIG. 2G) is partly overetched to form a groove (see 118a of FIG. 2G) and a second spacer (see 162 of FIG. 2H) may be formed in the groove.

According to the above-described embodiments, a height of the silicide layer 155a from the substrate 100, 200 is greater than a height of the top surface of a lower structure of the storage contact plug (e.g., first contact plugs 120, 220) from the substrate 100, 200. Therefore, when the third opening 172 for the fourth contact plug 180 that is an upper structure of the storage contact plug that electrically connects the first contact plug 120, 220 to the capacitor 190 is formed, the silicide layer 155a is higher above the substrate than the the top surfaces of the first contact plug 120, 220 (i.e., than the lower portion of the third opening 172). Consequently, even when the spacers 164 and 162 are etched, exposure of the silicide layer 155a to the etchant can be reduced or prevented, thereby reducing or preventing decomposing of the silicide layer 155a. As a result, the deterioration of the contact reliability of the bit line contact plug in the process for forming the storage contact plug can be reduced or prevented.

Furthermore, since, in some embodiments, two spacers 162 and 164 are formed around the silicide layer 155a, particularly, since the second spacer 162 is formed to cover the silicide layer 155a, the contact of the silicide layer 155a with the etchant can be reduced or prevented in subsequent etching processes. Therefore, the possibility of contact between the silicide layer 155a and the etchant can be significantly reduced. As a result, the contact reliability of the bit line contact plug in the process for forming the storage contact plug can be improved.

Referring again to FIG. 2J, the semiconductor device manufactured by the methods of the above-described embodiments includes a substrate 100 in which first and second active regions 102 and 104 are defined and on which a gate structure (not shown) is formed, a first contact plug 120 formed of a first conductive material that is electrically connected to the first active region 102, a second contact plug 130 formed of a second conductive material that is electrically connected to the second active region 104 and that has a height from the substrate 100 that is greater than the height of the first contact plug 120 from the substrate 100, a first interlayer insulation layer 106 that electrically insulats the first and second contact plugs 120 and 130 from each other, a third contact plug 150a formed of a third conductive material that is electrically connected to the second contact plug 130, a capping layer 160a formed on the third contact plug 150a, one or more spacers 162 and 164 formed on the side surface of the third contact plug 150a, a fourth contact plug 180 that is formed of a fourth conductive material that is electrically connected to the first contact plug 120 and that is insulated from the second and third contact plugs 130 and 150a by the spacers 162 and 164, and a second interlayer insulation layer 170 that electrically isolates the fourth contact plug 180.

In one embodiment, a region of the second contact plug 130 that is adjacent to the third contact plug 150a has a smaller cross-sectional width and/or area than does a region of the second contact plug 130 that is remote from the third contact plug 150a. Here, the spacer 162 may formed to extend to contact the portion of the second contact plug 130 that has a smaller cross-sectional width and/or area.

According to the above-described methods of manufacturing a semiconductor device, a height of the silicide layer from the substrate is greater than a height of the first contact plug from the substrate. The exposure of the silicide layer by etchant can be reduced or prevented during the etching process for forming the opening for the storage contact plug and thus the reaction between the silicide layer with the etchant can be reduced. As a result, the contact reliability of the bit line contact plug can be improved.

In addition, since the metal silicide layer formed in the bit line contact plug is protected by a dual-spacer, which can further improve the contact reliability of the bit line contact plug.

The foregoing is illustrative of example embodiments and is not to be construed as limiting thereof. Although example embodiments have been described, those skilled in the art will readily appreciate that many modifications are possible without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing a semiconductor device, the method comprising:
   forming a first interlayer insulation layer on a substrate that includes a first active region and a second active region;
   patterning the first interlayer insulation layer to form a first opening that exposes the first active region;
   depositing a first conductive material in the first opening to form a first contact plug;
   forming a second interlayer insulation layer on the first interlayer insulation layer and the first contact plug;
   forming a second opening in the first and second interlayer insulation layers that exposes the second active region;

depositing a second conductive material in the second opening to form a second contact plug, wherein a height of an upper surface of the second contact plug from the substrate is greater than a height of an upper surface of the first contact plug from the substrate;

forming a third contact plug on the second contact plug, wherein the third contact plug is electrically connected to the second contact plug, wherein a silicide layer is formed at an interface between the second contact plug and third contact plug, wherein a height of a lower surface of the silicide layer from the substrate is greater than a height of an upper surface of the first contact plug from the substrate;

forming a capping layer on the third contact plug;

forming a first spacer on a side surface of the third contact plug, wherein the first spacer covers an entirety of a side portion of the silicide layer and extends from the silicide layer to the second contact plug;

forming a third interlayer insulation layer on the second interlayer insulation layer, wherein the third interlayer insulation layer covers the third contact plug;

patterning the third interlayer insulation layer to form a third opening that exposes the first contact plug; and depositing a fourth conductive material in the third opening to form a fourth contact plug that is electrically connected to the first contact plug.

2. The method of claim 1, wherein forming the third contact plug and the capping layer further comprises forming a groove that spaces the second contact plug from the second interlayer insulation layer by over-etching a portion of the second contact plug such that a region of the second contact plug that is adjacent to the third contact plug has a smaller cross-sectional width than does a region of the second contact plug that is remote from the third contact plug.

3. The method of claim 2, further comprising forming a second spacer in the groove on a side surface of the third contact plug.

4. The method of claim 1, wherein the first and second active regions are drain and source regions, respectively, the first and fourth contact plugs are storage contact plugs that are connected to a capacitor, and the second and third contact plugs are bit line contact plugs that are connected to a bit line.

5. The method of claim 4, further comprising forming the capacitor that is electrically connected to the fourth contact plug.

6. The method of claim 1, wherein a gate structure that has etching selectivity with respect to the first interlayer insulation layer is further provided on the substrate, and the first and second openings are formed using the gate structure as an etching mask.

7. The method of claim 1, wherein the first spacer has etching selectivity with respect to the third interlayer insulation layer.

8. The method of claim 7, wherein the third opening is formed using the first spacer as an etching mask.

9. The method of claim 8, wherein the fourth contact plug is formed by partly etching the third interlayer insulation layer to form a groove and then further etching the exposed third interlayer insulation layer in the groove using the first spacer as an etching mask.

10. The method of claim 1, wherein each of the first, second, and third interlayer insulation layers comprises a silicon oxide layer, a silicon nitride layer, a silicon oxinitride layer, or a combination thereof.

11. The method of claim 1, wherein each of the first, second, and fourth conductive materials comprises polysilicon.

12. The method of claim 1, wherein the third contact plug comprises a monolayer having titanium, titanium nitride, tungsten, or a combination thereof or a multilayer in which each layer has titanium, titanium nitride, tungsten, or a combination thereof.

* * * * *